United States Patent
Imamura et al.

(10) Patent No.: US 11,002,811 B2
(45) Date of Patent: May 11, 2021

(54) MAGNETIC RESONANCE IMAGING DEVICE AND SUPERCONDUCTING MAGNET

(71) Applicant: HITACHI, LTD., Tokyo (JP)

(72) Inventors: Yukinobu Imamura, Tokyo (JP); Akira Kurome, Tokyo (JP); Shin Hoshino, Tokyo (JP); Takeshi Yatsuo, Tokyo (JP); Takuya Fujikawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/781,140

(22) Filed: Feb. 4, 2020

(65) Prior Publication Data
US 2020/0371178 A1 Nov. 26, 2020

(30) Foreign Application Priority Data
May 24, 2019 (JP) .............................. JP2019-097656

(51) Int. Cl.
*G01R 33/3815* (2006.01)
*G01R 33/38* (2006.01)
(Continued)

(52) U.S. Cl.
CPC ..... *G01R 33/3815* (2013.01); *G01R 33/3804* (2013.01); *G01R 33/3854* (2013.01); *G01R 33/4215* (2013.01)

(58) Field of Classification Search
CPC ............ G01R 33/3815; G01R 33/3804; G01R 33/4215; G01R 33/3854; G01R 33/3875;
(Continued)

(56) References Cited

U.S. PATENT DOCUMENTS

| 4,905,316 A | * | 2/1990 | Okamoto | ........... G01R 33/3815 324/319 |
| 5,446,433 A | * | 8/1995 | Laskaris | ............ G01R 33/3815 335/216 |

(Continued)

FOREIGN PATENT DOCUMENTS

JP H07-022231 A 1/1995

OTHER PUBLICATIONS

Z. Zhang, W. Shen and T. J. Havens, "Vibrational Magnetic Field Distortion Compensation System in MRI Superconducting Magnets," in IEEE Transactions on Applied Superconductivity, vol. 24, No. 3, pp. 1-4, Jun. 2014, Art No. 4400104 (Year: 2014).*

Primary Examiner — Daniel R Miller
(74) Attorney, Agent, or Firm — Baker Botts L.L.P.

(57) ABSTRACT

Provided are a magnetic resonance imaging device and a superconducting magnet capable of preventing generation of eddy currents accompanying vibration of a radiation shield and of reducing image quality deterioration. The superconducting magnet for a magnetic resonance imaging device includes a substantially cylindrical vacuum vessel, a substantially cylindrical radiation shield that is provided inside the vacuum vessel, and a superconducting coil that is provided inside the radiation shield. The radiation shield has an inner cylinder located radially inward of the superconducting coil. The inner cylinder of the radiation shield is provided with an annular rib formed in a circumferential direction about the central axis of the inner cylinder.

15 Claims, 7 Drawing Sheets

(51) Int. Cl.
*G01R 33/421* (2006.01)
*G01R 33/385* (2006.01)

(58) Field of Classification Search
CPC ... G01R 33/3873; G01R 33/387; G01R 33/42
See application file for complete search history.

(56) References Cited

U.S. PATENT DOCUMENTS

| | | | |
|---|---|---|---|
| 6,358,583 B1* | 3/2002 | Nagendra | G01R 33/3815 |
| | | | 335/216 |
| 2006/0266053 A1* | 11/2006 | Jiang | F25D 3/00 |
| | | | 62/51.1 |
| 2012/0075045 A1* | 3/2012 | Calvert | H01F 6/04 |
| | | | 335/216 |
| 2013/0154648 A1* | 6/2013 | Shen | G01R 33/34092 |
| | | | 324/322 |

* cited by examiner

MAGNETIC RESONANCE IMAGING DEVICE AND SUPERCONDUCTING MAGNET

CROSS REFERENCE TO RELATED APPLICATIONS

The present application relates to and claims priority from Japanese patent application No. 2019-097656, filed on May 24, 2019. The entirety of the contents and subject matter of all of the above is incorporated herein by reference.

BACKGROUND OF THE INVENTION

(1) Field of the Invention

The present invention relates to a magnetic resonance imaging device and a superconducting magnet.

(2) Description of the Related Art

A magnetic resonance imaging device (hereinafter, referred to as an MRI device) mainly includes a magnet device, a gradient magnetic field coil, a radio-frequency coil, and a computer system. The magnet device generates a uniform static magnetic field in an imaging space into which a subject is inserted. The gradient magnetic field coil generates a magnetic field whose intensity is spatially gradient (hereinafter, referred to as a gradient magnetic field) in a pulse manner in order to apply position information to the imaging space. The radio-frequency coil irradiates the subject with a high frequency electromagnetic wave pulse. The computer system processes a received signal and displays an image.

Methods for improving main performance of the MRI device include improving intensity of the static magnetic field generated by the magnet device, improving intensity of the gradient magnetic field by the gradient magnetic field coil, and improving magnetic field precision.

The static magnetic field is used to align directions of nuclear spins of an imaging subject. The larger the static magnetic field intensity, directions of more nuclear spins are aligned to obtain a clear image, and therefore, a magnet device that generates a static magnetic field of high intensity tends to be used. Hereinafter, a case will be described where a superconducting magnet is used as a magnet device that generates a static magnetic field of relatively high intensity.

The gradient magnetic field coil is used to apply position information to a magnetic resonance signal generated in the imaging space. Accurate position information can be obtained as the intensity of the gradient magnetic field becomes higher or as the magnetic field accuracy is close to a linear gradient distribution, and thus high-resolution image acquisition or imaging in a short time is possible. Therefore, in the gradient magnetic field coil, a configuration is necessary in which a larger current is supplied or a large number of coil conductors are wound, and a faster and higher current pulse conduction is required for the supplied current in the gradient magnetic field coil.

The radio-frequency coil is a coil that generates a magnetic resonance phenomenon in nuclear spins and acquires a magnetic resonance signal as an electromagnetic wave. It is necessary to irradiate the imaging subject with an electromagnetic wave of a frequency determined by the static magnetic field intensity in a uniform distribution in order to acquire a good image.

In a general horizontal magnetic field type MRI device, a gradient magnetic field coil has a substantially cylindrical shape and is provided substantially concentrically with a substantially cylindrical superconducting magnet on a radially inner side of the superconducting magnet. Further, a radio-frequency coil also has a substantially cylindrical shape and is provided substantially concentrically with the superconducting magnet and the gradient magnetic field coil on a radially inner side of the gradient magnetic field coil.

The Lorentz force is generated between a static magnetic field and a current flowing through a conductor constituting the gradient magnetic field coil when a large pulse current is supplied to the gradient magnetic field coil provided on the radially inner side of the superconducting magnet. Therefore, a vibration electromagnetic force is generated in the gradient magnetic field coil. On the other hand, a reaction force of the vibration electromagnetic force of the gradient magnetic field coil is also generated in the superconducting magnet.

The vibration electromagnetic forces generated in the gradient magnetic field coil and the superconducting magnet cause the whole MRI device to vibrate. The vibration of the MRI device affects performance. For example, the vibration of the gradient magnetic field coil indirectly causes a subject on a bed on which the radio-frequency coil and the subject are placed to vibrate since the gradient magnetic field coil often serves as a structure that supports the bed. In particular, a patient who is the subject may feel uncomfortable when a low-frequency vibration having a frequency equal to or less than 100 Hz is large. In addition, a blur may occur in an image to be acquired and the image quality may deteriorate when vibration of the subject is large. On the other hand, the reaction force of the vibration electromagnetic force of the gradient magnetic field coil generated in the superconducting magnet also causes a superconducting coil constituting the superconducting magnet and a magnetic body for magnetic field adjustment to vibrate. Accordingly, the static magnetic field intensity in the imaging space becomes non-uniform, which may cause deterioration of the original image quality.

In recent MRI devices, a combination of a superconducting magnet that generates a stronger static magnetic field and a gradient magnetic field coil that generates a gradient magnetic field with a strong and fast pulse is advancing in order to improve the image quality and shorten the imaging time. Therefore, the generated vibration electromagnetic force tends to increase. There is also a magnetic field due to eddy currents generated in a metal structure forming the superconducting magnet in addition to the vibration of the superconducting coil and the magnetic body mentioned above as a main cause of the non-uniform static magnetic field intensity and the image quality degradation. This is because eddy currents are generated when the metal structure vibrates in a strong magnetic field created by the superconducting coil.

In particular, the superconducting coil needs to be extremely cold in order to maintain a superconducting state. In general, the superconducting coil is immersed in 4 Kelvin liquid helium in a refrigerant vessel formed of stainless steel or the like. Further, the superconducting coil is surrounded by a radiation shield that reduces heat transfer between the refrigerant vessel and outside air, and a vacuum container. In general, the radiation shield is formed of an aluminum material having a small emissivity and the vacuum container is formed of a stainless material. The eddy currents are generated when these conductive metals vibrate in a magnetic field. In particular, the electric resistance of the radiation shield is reduced as compared with that in an ambient temperature since the radiation shield is a high-purity aluminum material and is held at a low temperature such as 70 Kelvin compared to the outside air temperature in order to reduce radiation heat transfer. Therefore, in this case, the eddy currents generated by the vibration increases and the influence on the image may not be ignored.

Japanese Patent Publication Number H7-22231 (PTL 1) is a background art of the invention. The publication describes a technique in which a plurality of slits are provided in an axial direction of a cylindrical radiation shield provided concentrically with a vacuum vessel and a superconducting coil. An FRP layer is provided on at least one of inner and outer peripheral surfaces of the cylindrical radiation shield so as to cover the slits. Accordingly, radiation shield vibration caused by an electromagnetic force and a consequential influence on an image are reduced.

According to the technique described in PTL 1, eddy currents generated in the radiation shield due to vibration can be reduced by providing the slits in the radiation shield.

However, the presence of the slits lowers rigidity of the radiation shield, and the vibration may increase even when receiving the same electromagnetic force. In the technique described in PTL 1, the FRP layer is provided to prevent an increase in vibration, but in general, the Young's modulus of an FRP material is about ⅕ of the Young's modulus of an aluminum material which is a metal. Therefore, in order to obtain the same rigidity, the thickness of the FRP material needs to be sufficiently larger than a plate thickness of the cylinder of the radiation shield. In addition, a reason why the radiation shield is formed of an aluminum material is that the temperature of the entire radiation shield needs to be uniform. A radiation rate would not change even when a thin aluminum material film is applied to a surface of a radiation shield formed of a high resistance or a non-conductive material since emissivity depends only on a surface state. However, when a temperature difference occurs in the radiation shield, an amount of heat transferred from a part having a high temperature to the refrigerant vessel increases, and accordingly, the temperature of the entire radiation shield needs to be kept as low as possible. Therefore, the entire radiation shield needs to be formed of an aluminum material or a copper material having a high thermal conductivity. The temperature of the radiation shield may not be uniform due to the presence of the slits since the thermal conductivity of FRP is smaller than that of metal. In particular, a temperature difference tends to occur in the circumferential direction around the central axis of the radiation shield, which is a direction orthogonal to the slits.

SUMMARY OF THE INVENTION

The invention is formed in view of the above circumstances and an object thereof is to provide a magnetic resonance imaging device and a superconducting magnet capable of preventing generation of eddy currents accompanying vibration of a radiation shield and reducing image quality deterioration.

In order to achieve the above object, the magnetic resonance imaging device according to the invention includes a superconducting magnet, a gradient magnetic field coil, a radio-frequency coil, and a computer system. The superconducting magnet has a substantially cylindrical shape and generates a static magnetic field in an imaging space. The gradient magnetic field coil has a substantially cylindrical shape, is radially inward of the superconducting magnet and is substantially concentrical with a central axis of the superconducting magnet, and generates a dynamic magnetic field with its magnetic field intensity having a linear gradient corresponding to positions in the imaging space. The radio-frequency coil has a substantially cylindrical shape, is radially inward of the gradient magnetic field coil and is substantially concentrical with the central axis of the superconducting magnet, and generates a radio-frequency electromagnetic field in the imaging space. The computer system processes a signal and obtains an image. The superconducting magnet includes a substantially cylindrical vacuum vessel, a substantially cylindrical radiation shield that is provided inside the vacuum vessel, and a superconducting coil that is provided inside the radiation shield. The radiation shield includes an inner cylinder located radially inward of the superconducting coil. The inner cylinder is provided with an annular rib that is formed in a circumferential direction about a central axis of the inner cylinder.

According to the invention, a magnetic resonance imaging device and a superconducting magnet capable of preventing generation of eddy currents accompanying vibration of a radiation shield and reducing image quality deterioration can be provided.

DETAILED DESCRIPTION OF THE INVENTION

Hereinafter, embodiments of the invention will be described in detail with reference to the drawings as appropriate.

First Embodiment

Figure 2:
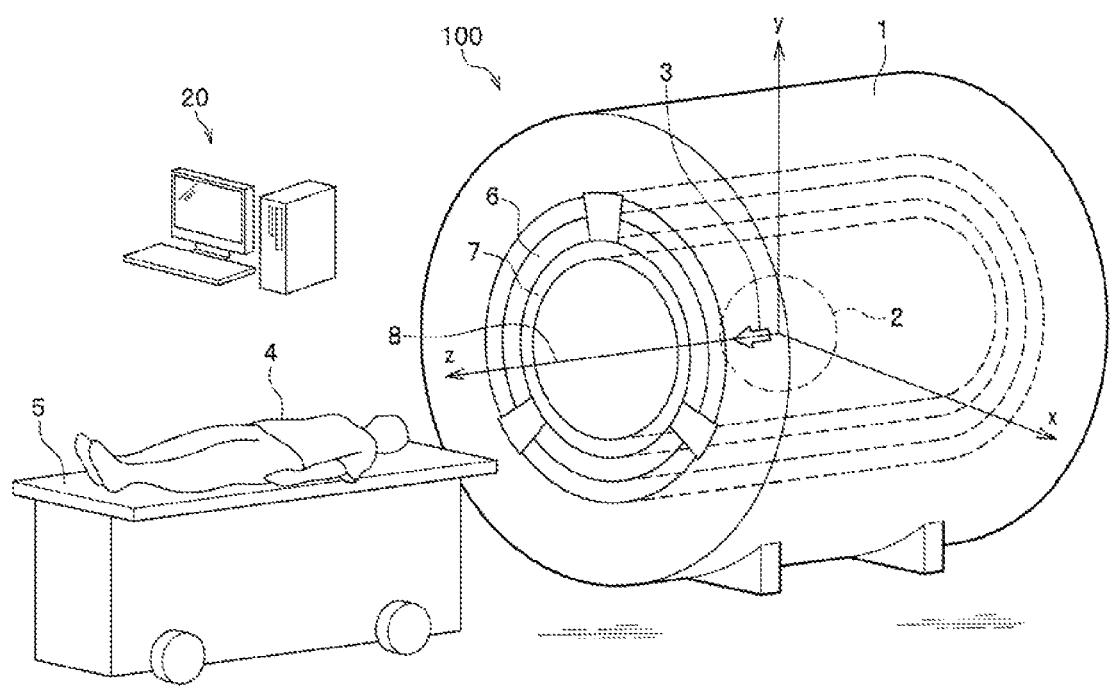
FIG. 2 is an external perspective view schematically showing the MRI device according to the embodiment of the invention.

FIG. 2 is an external perspective view schematically showing an MRI device 100 according to the embodiment of the invention.

Figure 1:
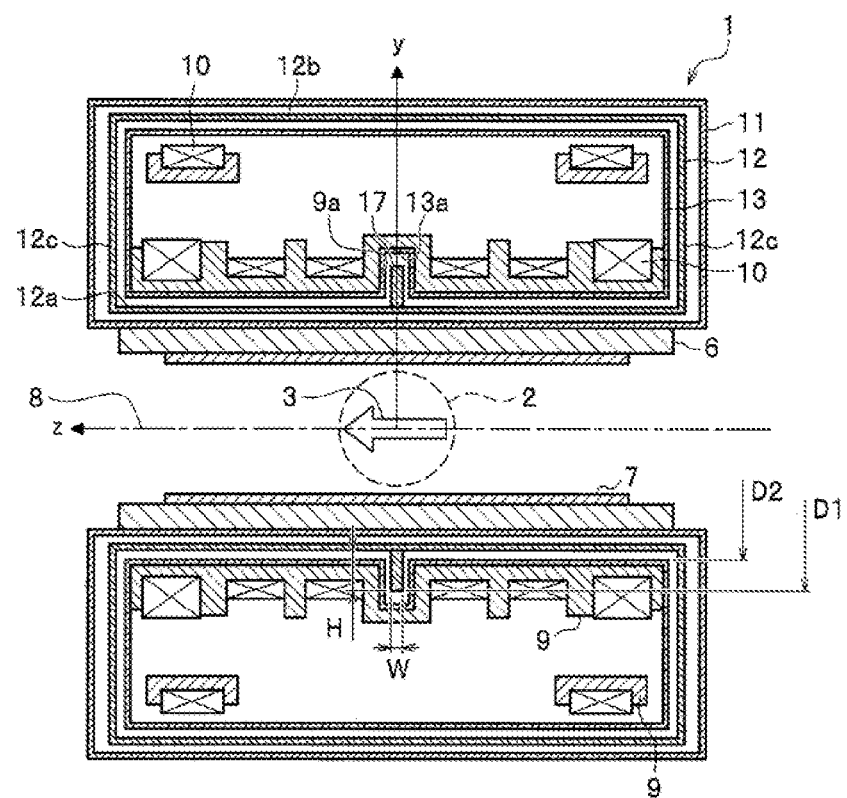
FIG. 1 is a schematic sectional view showing a superconducting magnet, a gradient magnetic field coil, and a radio-frequency coil of an MRI device according to a first embodiment of the invention.

As shown in FIG. 2, the MRI device 100 includes a superconducting magnet 1 having a superconducting coil 10 (see FIG. 1). The superconducting magnet 1 has a substantially cylindrical shape having a Z axis as a central axis 8 and generates a static magnetic field 3 indicated by a white arrow in the same direction as the Z axis in an imaging space 2. A subject 4 is transported to the imaging space 2 by a movable bed 5 to acquire an image.

The MRI device 100 includes a substantially cylindrical gradient magnetic field coil 6 and a radio-frequency coil 7 provided substantially concentrically with the central axis 8 of the superconducting magnet 1 radially inward of the superconducting magnet 1. That is, the superconducting magnet 1, the gradient magnetic field coil 6, and the radio-frequency coil 7 have the common central axis 8. The gradient magnetic field coil 6 is a normal conductive coil that acquires position information of image acquisition. The gradient magnetic field coil 6 generates a dynamic magnetic field with a magnetic field intensity having a linear gradient corresponding to positions in the imaging space 2. The radio-frequency coil 7 is a normal conductive coil that acquires a signal that causes magnetic resonance. The radio-frequency coil 7 generates a radio-frequency electromagnetic field in the imaging space 2. The gradient magnetic field coil 6 and the radio-frequency coil 7 are covered with a cover (not shown) together with the superconducting magnet 1.

The MRI device 100 includes a power supply device (not shown) and a computer system 20 as main components other than the above. The power supply device supplies a current to the gradient magnetic field coil 6 and the radio-frequency coil 7. The computer system 20 processes a signal and obtains an image. The computer system 20 also receives an operation and displays an image.

Next, a configuration of a general MRI device will be described with reference to FIG. 3.

Figure 3:
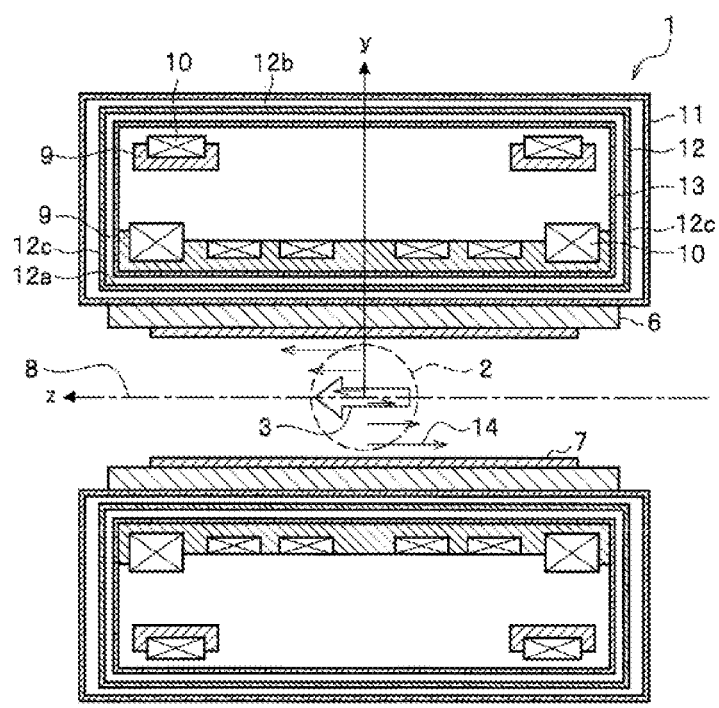
FIG. 3 is a schematic sectional view showing a superconducting magnet, a gradient magnetic field coil, and a radio-frequency coil of an MRI device in the related art according to a comparative example.

FIG. 3 is a schematic sectional view showing the superconducting magnet 1, the gradient magnetic field coil 6, and the radio-frequency coil 7 of an MRI device in the related art according to a comparative example.

As shown in FIG. 3, the superconducting magnet 1 includes the superconducting coil 10. The superconducting coil 10 is formed by winding a superconducting wire material on a coil bobbin 9 that is a winding frame formed of a stainless steel material or the like and hardening the superconducting wire material by an epoxy resin or the like. The superconducting coil 10 is kept at an extremely low temperature of about 4 Kelvin to obtain a superconducting state, and a strong magnetic field of, for example, 1.5 Tesla to 3 Tesla is generated in the imaging space 2 by supplying a large current. The superconducting coil 10 has a structure of being surrounded by a vacuum vessel 11, a radiation shield 12, and a refrigerant vessel 13 from the outside as the atmosphere in order to maintain the superconducting coil 10 at a very low temperature.

The vacuum vessel 11 is formed of a stainless material, an aluminum material, a fiber-reinforced plastic (FRP) material, or the like. The vacuum vessel 11 reduces heat transfer to the internal structure due to convection by setting the inside of the vacuum vessel 11 into a vacuum state. The radiation shield 12 is formed of an aluminum material, a copper material, or the like, and reduces radiant heat transfer from the outside by using a glossy metal having a low emissivity on its surface. The radiation shield 12 has an inner cylinder 12a located radially inward of the superconducting coil 10, an outer cylinder 12b located radially outward of the superconducting coil 10, and an annular end plate 12c located axially by both sides of the superconducting coil 10. The refrigerant vessel 13 is a structure formed of a stainless material or the like in order to maintain the superconducting coil 10 in a superconducting state by immersing the superconducting coil 10 in liquid helium at a temperature of about 4 Kelvin.

Further, a refrigerator (not shown) is provided in the radiation shield 12 and the refrigerant vessel 13, thereby maintaining an extremely-low-temperature state while preventing evaporation of the liquid helium. Further, the superconducting coil 10, the refrigerant vessel 13, and the radiation shield 12 are supported in the vacuum vessel 11 by a support member having a large thermal resistance (not shown) in order to prevent heat intrusion from the outside. The support member is formed of an FRP material having a low thermal conductivity, for example, a rod-shaped or chain-shaped elongated member having a small cross-sectional area is used.

When a pulse-manner current is supplied to the gradient magnetic field coil 6, a gradient magnetic field 14 is generated in the imaging space 2. At this time, a vibration electromagnetic force is generated between the gradient magnetic field coil 6 and the static magnetic field 3 generated by the superconducting coil 10. Conversely, a vibration electromagnetic force is generated between the superconducting coil 10 and a leakage magnetic field outward of the imaging space 2 due to the gradient magnetic field coil 6. These vibration electromagnetic forces cause the entire MRI device 100 to vibrate. The gradient magnetic field 14 shown in FIG. 3 is an example of a Y-axis direction gradient magnetic field, and the gradient magnetic field coil 6 generates a gradient magnetic field having a magnetic flux density distribution whose intensity is inclined in any of three axial directions of X, Y, and Z with independent pulse waveforms.

When the superconducting coil 10 vibrates, a distribution of the static magnetic field 3 generated in the imaging space 2 is disturbed and an MRI image is affected. At the same time, the vacuum vessel 11, although the radiation shield 12, and the refrigerant vessel 13 also vibrate, eddy currents are generated when they vibrate in the static magnetic field 3 created by the superconducting coil 10 since these are metal structures. A magnetic field generated by the eddy currents also causes the disturbed distribution of the static magnetic field 3 in the imaging space 2.

In particular, it is known that eddy currents are generated even with a small vibration since the radiation shield 12 is formed of a low-resistance metal such as an aluminum material or a copper material. Therefore, in related arts, a countermeasure of increasing a resistance value of an eddy current path by providing, for example, a slit, is taken in order to prevent the generation of eddy currents. However, the generated eddy currents may increase since the rigidity of the radiation shield 12 is reduced by the slit and vibration amplitude is increased.

Next, the generation of eddy currents when the inner cylinder 12a of the radiation shield 12 vibrates will be described with reference to FIGS. 4A, 4B, 5A, and 5B.

It may be said that the static magnetic field 3 by the superconducting coil 10 is uniform in the imaging space 2 and the distribution of the static magnetic field 3 in the inner cylinder 12a of the radiation shield 12 is substantially uniform.

Figure 4A:
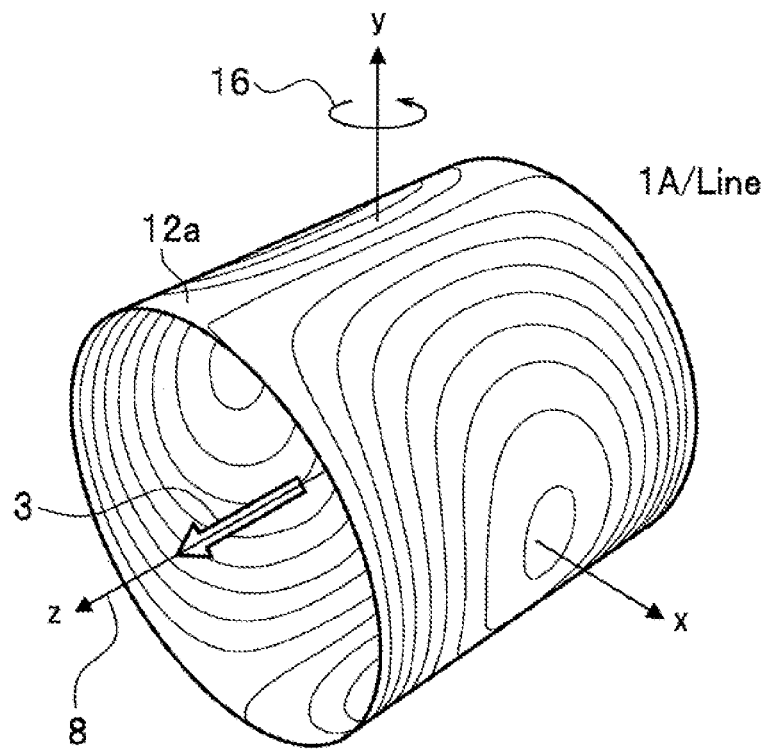
FIG. 4A is a perspective view showing a result of eddy current simulation when an inner cylinder of a radiation shield vibrates in a rotation direction about an axis orthogonal to a static magnetic field direction in a static magnetic field.
Figure 4B:
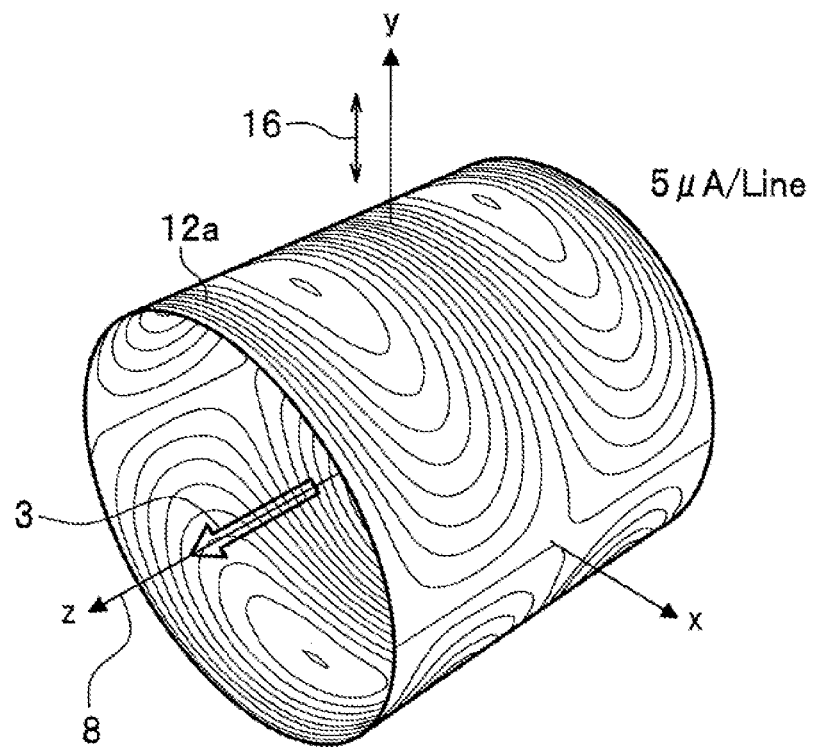
FIG. 4B is a perspective view showing a result of eddy current simulation when the inner cylinder of the radiation shield vibrates in an axial direction orthogonal to the static magnetic field direction in the static magnetic field.

FIG. 4A is a perspective view showing a result of eddy current simulation when the inner cylinder 12a of the radiation shield 12 vibrates in a rotation direction (see a reference numeral 16 in FIG. 4A) about a y-axis orthogonal to a direction of the static magnetic field 3 in the static magnetic field 3. FIG. 4B is a perspective view showing a result of eddy current simulation when the inner cylinder 12a of the radiation shield 12 vibrates in a y-axis direction (see the reference numeral 16 in FIG. 4B) orthogonal to the static magnetic field 3 direction in the static magnetic field 3.

An interval between adjacent eddy current value isolines shown in FIG. 4A is 1 A (ampere) and an interval between adjacent eddy current value isolines shown in FIG. 4B is 5 µA. As shown in FIGS. 4A and 4B, in the uniform static magnetic field 3, the generated eddy currents are small even when the inner cylinder 12a of the radiation shield 12 vibrates in the rotation direction about the y-axis orthogonal to the direction of the static magnetic field 3 or vibrates in parallel along the y-axis. In particular, when vibrating along the y-axis direction orthogonal to the direction of the static magnetic field 3, it can be seen that the generation of the eddy currents is negligibly small when compared with the case of vibrating in the rotation direction about the y-axis.

Figure 5A:
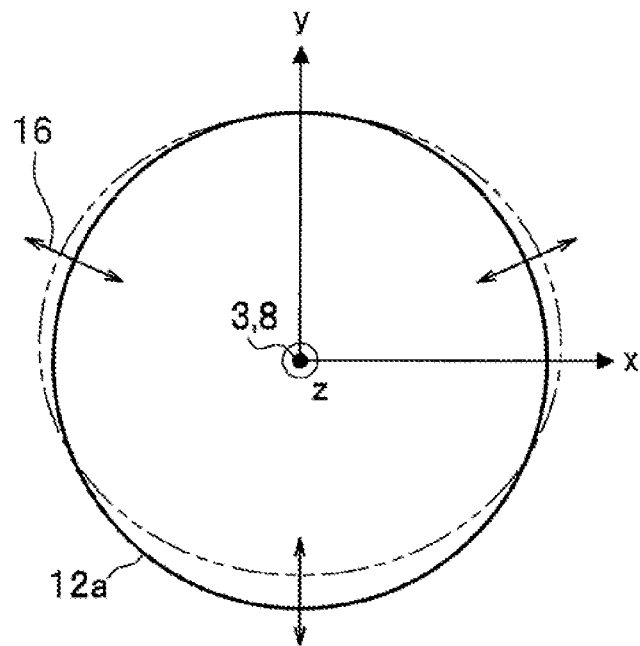
FIG. 5A is a front view of a vibration state when the inner cylinder of the radiation shield vibrates with its cross-sectional shape changing in the direction orthogonal to the static magnetic field direction in the static magnetic field.
Figure 5B:
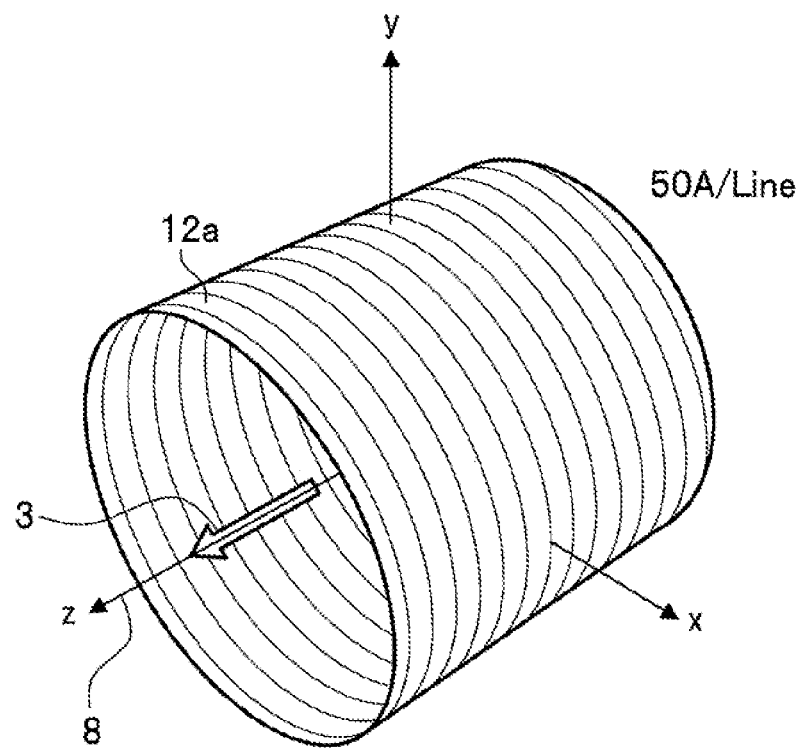
FIG. 5B is a perspective view showing a result of eddy current simulation when the inner cylinder of the radiation shield vibrates with its cross-sectional shape changing in the direction orthogonal to the static magnetic field direction in the static magnetic field.

FIG. 5A is a front view of a vibration state when the inner cylinder 12a of the radiation shield 12 vibrates with its cross-sectional shape changing in a direction orthogonal to the direction of the static magnetic field 3 in the static magnetic field 3. FIG. 5B is a perspective view showing a result of eddy current simulation when the inner cylinder 12a of the radiation shield 12 vibrates with its cross-sectional shape changing in the direction orthogonal to the direction of the static magnetic field 3 in the static magnetic field 3. FIGS. 5A and 5B show a case of the same degree of displacement as in FIGS. 4A and 4B.

FIGS. 4A and 4B show a case where the inner cylinder 12a vibrates as a rigid body without deformation. On the other hand, FIG. 5B shows a result of eddy current simulation when the cross sectional shape of the inner cylinder 12a is deformed in the direction shown in FIG. 5A (see the reference numeral 16 in FIG. 5A). The interval between adjacent eddy current value isolines shown in FIG. 5B is 50 A, which is very large compared with the case shown in FIGS. 4A and 4B. Also, in this case, the inner cylinder 12a vibrates in the direction orthogonal to the static magnetic field 3 direction. However, in this case, it can be seen that big eddy currents are generated due to change in the cross-sectional shape of the inner cylinder 12a by the vibration.

Next, a configuration of the superconducting magnet 1 of the MRI device 100 (see FIG. 2, and the same applies to the following description) according to the first embodiment of the invention will be described with reference to FIG. 1. Hereinafter, the first embodiment of the invention will be mainly described in terms of differences from a configuration of the superconducting magnet 1 of the general MRI device shown in FIG. 3, common components and similar components will be denoted by the same reference numerals, and the description thereof will be omitted as appropriate.

FIG. 1 is a schematic sectional view showing the superconducting magnet 1, the gradient magnetic field coil 6, and the radio-frequency coil 7 of the MRI device 100 according to the first embodiment of the invention.

As shown in FIG. 1, in the first embodiment of the invention, the superconducting magnet 1 for the MRI device 100 includes the substantially cylindrical vacuum vessel 11, the substantially cylindrical radiation shield 12 located in the vacuum vessel 11, and the superconducting coil 10 located in the radiation shield 12. The radiation shield 12 has the inner cylinder 12a located radially inward of the superconducting coil 10. The inner cylinder 12a of the radiation shield 12 is provided with an annular rib 17 formed along a circumferential direction about the central axis 8 of the inner cylinder 12a. The rib 17 is fixed to the inner cylinder 12a.

According to the first embodiment, generation of eddy currents can be reduced since the change of the cross-sectional shape of the inner cylinder 12a due to the vibration shown in FIG. 5A can be prevented by presence of the annular rib 17. Accordingly, it is possible to keep influence of the vibration on the image small. Here, since the radiation shield 12 has a small electric resistance, eddy currents are easily generated, and the inner cylinder 12a of the radiation shield 12 is likely to affect the image because it is close to the imaging space 2. Therefore, deterioration of image quality can be effectively reduced by preventing generation of eddy currents in the inner cylinder 12a of the radiation shield 12.

In addition, in the first embodiment, the rib 17 has a height H in a radial direction larger than a length W in the axial direction in a cross section including the central axis 8 of the inner cylinder 12a, and is provided in at least one place on a radially outer side of the inner cylinder 12a. An outer diameter D1 of the rib 17 is larger than an inner diameter D2 of the refrigerant vessel 13 in which the superconducting coil 10 is disposed inside. The outer diameter D1 of the rib 17 is larger than an inner diameter of the superconducting coil 10 located next to the rib 17 here. A plurality of superconducting coils 10 are provided, and the rib 17 is provided between two adjacent superconducting coils 10 without interference with the superconducting coils 10. Then, the refrigerant vessel 13 is formed with a recess 13a that expands an inner diameter of a part of the refrigerant vessel 13 radially outward so as to allow an outer peripheral part of the rib 17 to enter. Accordingly, the coil bobbin 9 also includes a recess 9a that radially outward expands an inner diameter of a part of the coil bobbin 9. According to the configuration, the height H of the rib 17 in the radial direction can be large while avoiding interference between the rib 17 and the refrigerant vessel 13, the superconducting coil 10, and the coil bobbin 9. Therefore, rigidity of the inner cylinder 12a is improved, and deformation of the inner cylinder 12a of the radiation shield 12 is effectively prevented.

The rib 17 may be formed of a material having sufficient rigidity for the inner cylinder 12a of the radiation shield 12. For example, the material of the rib 17 may be a metal material such as an aluminum material or a stainless material, a ceramic material, or the like.

When the rib 17 is formed of a metal material, the rib 17 may be directly connected to the inner cylinder 12a of the radiation shield 12 or may be electrically insulated from the inner cylinder 12a by being connected thereto via an insulating layer (not shown).

The cooling effect in a circumferential direction of the inner cylinder 12a of the radiation shield 12 can be expected to be improved by using a metal material as the material of the rib 17. In addition, radiation heat transfer to the refrigerant vessel 13 can be reduced since the temperature of the radiation shield 12 is uniformized due to heat transfer by the rib 17. Further, there is an advantage that the rigidity of the inner cylinder 12a and the heat transfer by the rib 17 can be further improved by connecting the rib 17 directly to the inner cylinder 12a. On the other hand, there is an advantage that it is possible to increase the electric resistance of the current path to further prevent the generation of eddy currents by causing the rib 17 to be electrically insulated from the inner cylinder 12a.

Although the rib 17 is located at one center position in the Z-axis direction of the inner cylinder 12a in FIG. 1, it is possible to further prevent a change in the cross-sectional shape of the inner cylinder 12a due to vibration by providing the rib 17 at a plurality of places. Here, the rib 17 is arranged to be symmetrical relative to a plane orthogonal to the center axis 8 of the superconducting magnet 1 through a center of the imaging space 2. According to this configuration, it is possible to effectively prevent a change in the cross-sectional shape of the inner cylinder 12a due to vibration with a small number of ribs 17 installed.

Second Embodiment

Next, a configuration of the superconducting magnet 1 of the MRI device 100 according to a second embodiment of the invention will be described with reference to FIG. 6.

Hereinafter, the second embodiment of the invention will be mainly described in terms of differences from the superconducting magnet 1 of the MRI device 100 according to the first embodiment shown in FIG. 1, common components and similar components will be denoted by the same reference numerals, and the description thereof will be omitted as appropriate.

Figure 6:
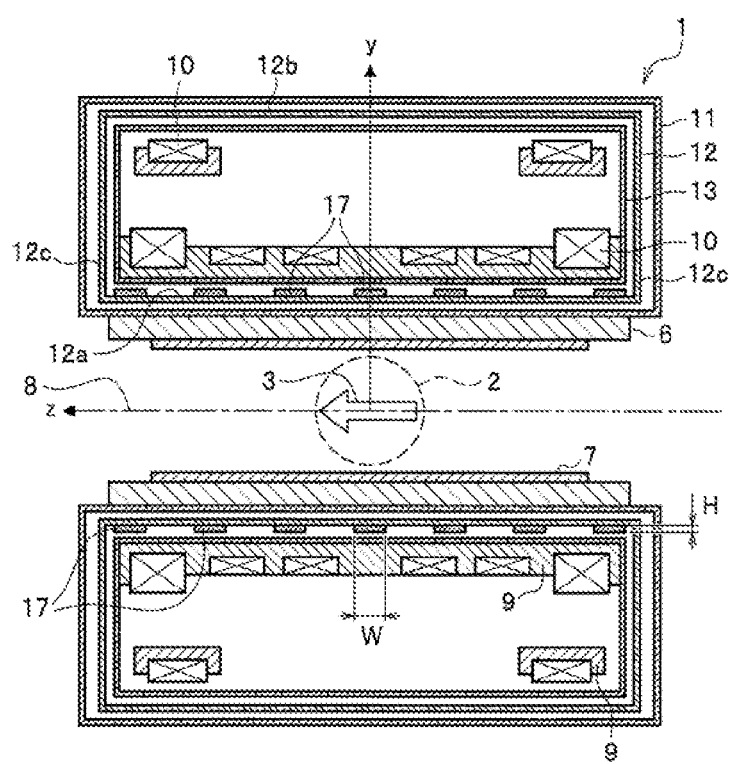
FIG. 6 is a schematic sectional view showing a superconducting magnet, a gradient magnetic field coil, and a radio-frequency coil of an MRI device according to a second embodiment of the invention.

FIG. 6 is a schematic sectional view showing the superconducting magnet 1, the gradient magnetic field coil 6, and the radio-frequency coil 7 of the MRI device 100 according to the second embodiment of the invention.

As shown in FIG. 6, in the second embodiment of the invention, the rib 17 has the height H in the radial direction smaller than the length W in the axial direction in a cross section including the central axis 8 of the inner cylinder 12a. At least one (seven in FIG. 6) ribs 17 are provided on a radially outer side of the inner cylinder 12a. According to this configuration, as compared with the first embodiment, it is not necessary to form the recess 13a in the refrigerant vessel 13 or to form the recess 9a in the coil bobbin 9 in order to avoid interference with the rib 17 since the height H in the radial direction is small.

As in the first embodiment, a material of the rib 17 may be considered to be a metal material such as an aluminum material or a stainless material, a ceramic material, or the like. The cooling effect in the circumferential direction of the inner cylinder 12a of the radiation shield 12 can be improved and the radiation heat transfer to the refrigerant vessel 13 due to the uniformity of the temperature of the radiation shield 12 can be reduced by using a metal material as the material of the rib 17.

In the present embodiment, the rib 17 is provided on the radially outer side of the inner cylinder 12a of the radiation shield 12, but may also be provided on a radially inner side, or further, both on the radially outer side and on the radially inner side.

Third Embodiment

Next, a configuration of the superconducting magnet 1 of the MRI device 100 according to a third embodiment of the invention will be described with reference to FIGS. 7A and 7B. Hereinafter, the third embodiment of the invention will be mainly described in terms of differences from the superconducting magnet 1 of the MRI device 100 according to the second embodiment shown in FIG. 6, common components and similar components will be denoted by the same reference numerals, and the description thereof will be omitted as appropriate.

Figure 7A:
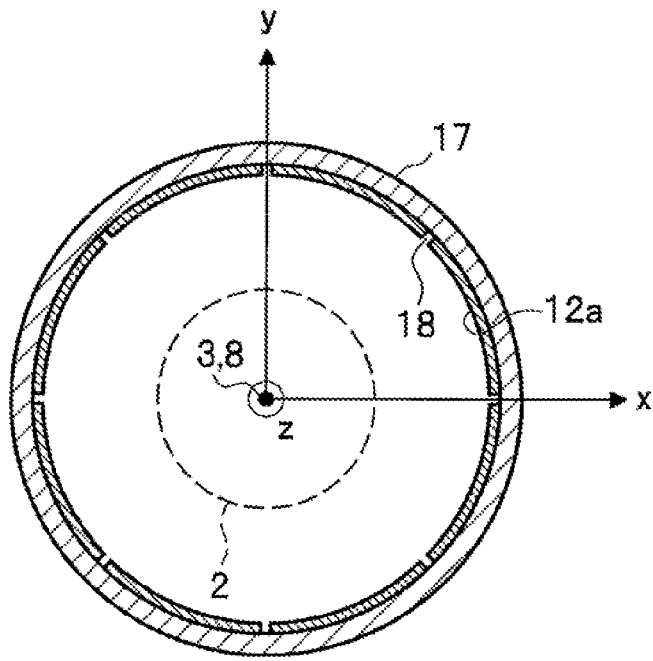
FIG. 7A is a schematic front sectional view showing an inner cylinder of a radiation shield of a superconducting magnet of an MRI device according to a third embodiment of the invention.

FIG. 7A is a schematic front sectional view showing the inner cylinder 12a of the radiation shield 12 of the superconducting magnet 1 constituting the MRI device 100 according to the third embodiment of the invention. FIG. 7B is a schematic perspective view showing a part of the inner cylinder 12a of the radiation shield 12 of the superconducting magnet 1 constituting the MRI device 100 according to the third embodiment of the invention.

Figure 7B:
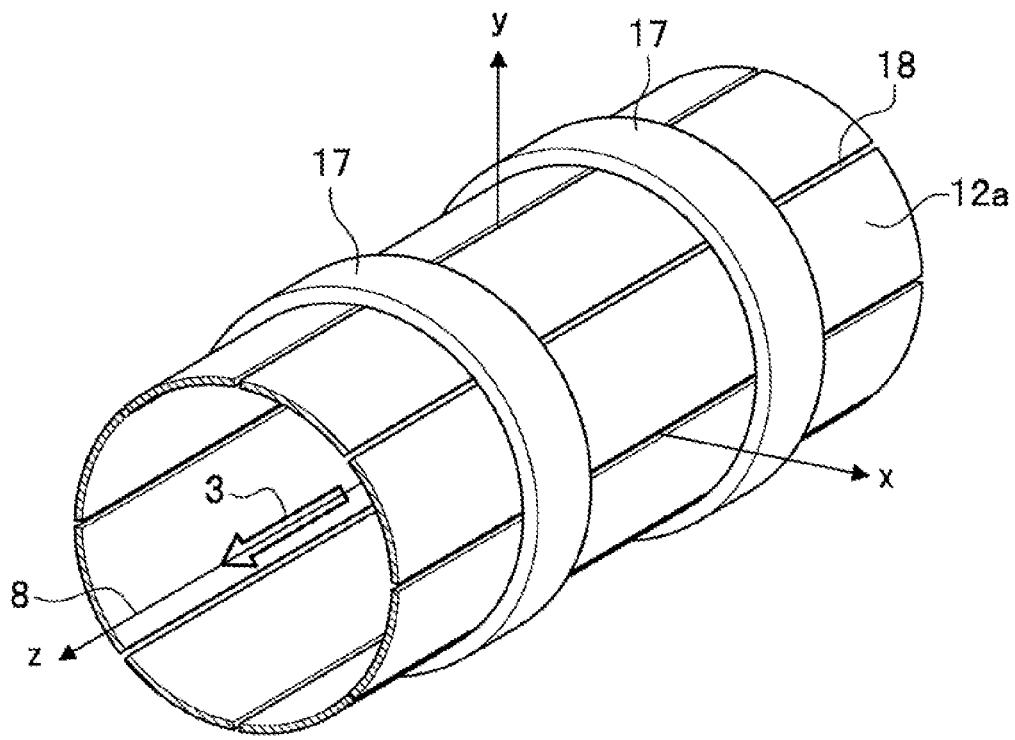
FIG. 7B is a schematic perspective view showing a part of the inner cylinder of the radiation shield of the superconducting magnet of the MRI device according to the third embodiment of the invention.

As shown in FIGS. 7A and 7B, in the third embodiment of the invention, a slit 18 extending in a direction parallel to the central axis 8 of the inner cylinder 12a is formed on the inner cylinder 12a of the radiation shield 12. In the third embodiment, similarly to the second embodiment, the inner cylinder 12a of the radiation shield 12 is provided with the annular rib 17 formed along the circumferential direction about the central axis 8 of the inner cylinder 12a. According to this configuration, generation of eddy currents in the circumferential direction accompanying vibration of the radiation shield 12 can be prevented by the slit 18 and be further reduced by preventing deformation of the cross-sectional shape by the rib 17.

In the present embodiment, when the rib 17 is formed of an aluminum material or a metal material such as stainless steel, the rib 17 and the inner cylinder 12a of the radiation shield 12 may be electrically insulated by being connected via an insulating layer. If a thickness of the insulating layer between the rib 17 and the inner cylinder 12a of the radiation shield 12 is small, rigidity and heat transfer in the circumferential direction of the inner cylinder 12a of the radiation shield 12 are ensured by the annular rib 17. As a result, it is possible to reduce generation of eddy currents caused by vibration and to achieve uniform temperature due to improvement of the cooling effect.

Although the invention has been described with reference to the embodiments, the invention is not limited to the embodiments described above and includes various modifications. For example, the embodiments described above are described in detail for easy understanding of the invention, and the invention is not necessarily limited to the embodiments including all the configurations described above. In addition, a part of the configuration of a certain embodiment can be replaced with the configuration of another embodiment, and the configuration of another embodiment can be added to the configuration of a certain embodiment. A part of a configuration of the embodiments can be added, deleted, or replaced with another configuration.

For example, the invention is also applicable to a case where the superconducting coil 10 is directly cooled by a refrigerator or the like without using a refrigerant such as liquid helium.

What is claimed is:

1. A magnetic resonance imaging device comprising:
a substantially cylindrical superconducting magnet that generates a static magnetic field in an imaging space;
a substantially cylindrical gradient magnetic field coil that is radially inward of the superconducting magnet and is substantially concentrical with a central axis of the superconducting magnet, and generates a dynamic magnetic field with its magnetic field intensity having a linear gradient corresponding to positions in the imaging space;
a substantially cylindrical radio-frequency coil that is radially inward of the gradient magnetic field coil and is substantially concentrical with the central axis of the superconducting magnet, and generates a radio-frequency electromagnetic field in the imaging space; and
a computer system that processes a signal and obtains an image, wherein
the superconducting magnet includes
a substantially cylindrical vacuum vessel;
a substantially cylindrical radiation shield that is provided inside the vacuum vessel; and
a superconducting coil that is provided inside the radiation shield and disposed in a refrigerant vessel,
the radiation shield has an inner cylinder located radially inward of the superconducting coil, and
the inner cylinder is provided with an annular rib that is formed in a circumferential direction about a central axis of the inner cylinder, wherein the rib has a height in a radial direction larger than its length in an axial direction in a cross section including the central axis of the inner cylinder, and is provided in at least one place on a radially outer side of the inner cylinder.

2. The magnetic resonance imaging device according to claim 1, wherein:
an outer diameter of the rib is larger than an inner diameter of the refrigerant vessel, and
the refrigerant vessel is formed with a recess that expands an inner diameter of a part of the refrigerant vessel radially outward so as to allow an outer peripheral part of the rib to enter.

3. The magnetic resonance imaging device according to claim 1, wherein
the rib has a height in a radial direction smaller than its length in an axial direction in a cross section including the central axis of the inner cylinder, and is provided in at least one place on a radially inner side or a radially outer side, or on both the radially inner side and the radially outer side of the inner cylinder.

4. The magnetic resonance imaging device according to claim 1, wherein
the rib is symmetrical relative to a plane orthogonal to the central axis of the superconducting magnet through a center of the imaging space.

5. The magnetic resonance imaging device according to claim 1, wherein
the rib is formed of a metal material.

6. The magnetic resonance imaging device according to claim 5, wherein
the rib is connected to the inner cylinder via an insulating layer.

7. The magnetic resonance imaging device according to claim 5, wherein
the rib is directly connected to the inner cylinder.

8. The magnetic resonance imaging device according to claim 1, wherein
a slit extending in a direction parallel to the central axis of the inner cylinder is formed in the inner cylinder.

9. The magnetic resonance imaging device according to claim 1, wherein
a slit extending in a direction parallel to the central axis of the inner cylinder is formed in the inner cylinder.

10. The magnetic resonance imaging device according to claim 3, wherein
a slit extending in a direction parallel to the central axis of the inner cylinder is formed in the inner cylinder.

11. The magnetic resonance imaging device according to claim 4, wherein
a slit extending in a direction parallel to the central axis of the inner cylinder is formed in the inner cylinder.

12. The magnetic resonance imaging device according to claim 5, wherein
a slit extending in a direction parallel to the central axis of the inner cylinder is formed in the inner cylinder.

13. The magnetic resonance imaging device according to claim 6, wherein
a slit extending in a direction parallel to the central axis of the inner cylinder is formed in the inner cylinder.

14. The magnetic resonance imaging device according to claim 7, wherein
a slit extending in a direction parallel to the central axis of the inner cylinder is formed in the inner cylinder.

15. A superconducting magnet for a magnetic resonance imaging device, the superconducting magnet comprising:
a substantially cylindrical vacuum vessel;
a substantially cylindrical radiation shield that is provided inside the vacuum vessel;
a refrigerant vessel that is provided inside the radiation shield; and
a superconducting coil that is provided inside the refrigerant vessel,
wherein
the radiation shield has an inner cylinder located radially inward of the superconducting coil, and
the inner cylinder is provided with an annular rib that is formed in a circumferential direction about a central axis of the inner cylinder, wherein the rib has a height in a radial direction larger than its length in an axial direction in a cross section including the central axis of the inner cylinder, and is provided in at least one place on a radially outer side of the inner cylinder.

* * * * *